United States Patent
Kubala et al.

(10) Patent No.: US 9,876,051 B2
(45) Date of Patent: Jan. 23, 2018

(54) MINIATURE WAFER-LEVEL CAMERA MODULES

(71) Applicant: OmniVision Technologies, Inc., Santa Clara, CA (US)

(72) Inventors: Kenneth Kubala, Boulder, CO (US); Paulo E. X. Silveira, Boulder, CO (US); Satoru Tachihara, Boulder, CO (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/969,317

(22) Filed: Dec. 15, 2015

(65) Prior Publication Data
US 2016/0099284 A1 Apr. 7, 2016

Related U.S. Application Data

(62) Division of application No. 13/071,892, filed on Mar. 25, 2011, now abandoned.

(51) Int. Cl.
*H01L 27/146* (2006.01)
*H04N 5/225* (2006.01)
(Continued)

(52) U.S. Cl.
CPC .......... *H01L 27/14685* (2013.01); *B26F 1/38* (2013.01); *B29D 11/00298* (2013.01);
(Continued)

(58) Field of Classification Search
CPC .............. G02B 13/0085; G02B 3/0031; G02B 13/006; G02B 13/001; G02B 5/201;
(Continued)

(56) References Cited

U.S. PATENT DOCUMENTS 5,975,875 A * 11/1999 Crowe, Jr. .......... B29C 33/0055 249/117
6,368,522 B1 * 4/2002 Ansell ................. B29C 33/0055 264/1.1
(Continued)

FOREIGN PATENT DOCUMENTS

TW   201107794 A   3/2011

OTHER PUBLICATIONS

Lieb et al. ("New wafer-level-packaging technology using silicon-via-contacts for optical and other sensor applications," 2004 Proceedings. 54th Electronic Components and Technology Conference (IEEE Cat. No. 04CH37546), 2004, pp. 843-847 vol. 1).*
(Continued)

*Primary Examiner* — William C Vaughn, Jr.
*Assistant Examiner* — Naod Belai
(74) *Attorney, Agent, or Firm* — Christensen O'Connor Johnson Kindness PLLC (57) ABSTRACT

In one aspect, a method includes providing a lens substrate having an array of lenses. The lens substrate includes an overflow region next to each lens of the array. Each overflow region includes an overflow lens material. The method also includes separating the lens substrate into a plurality of smaller lens substrates. Each of the smaller lens substrates has one of the single lens and the plurality of stacked lenses. Separating the lens substrate into the smaller lens substrates may include removing or substantially removing the overflow regions. In one aspect, the method may be performed as a method of making a miniature camera module. Other methods are also described, as are miniature camera modules.

12 Claims, 8 Drawing Sheets

(51) Int. Cl.
*B26F 1/38* (2006.01)
*B29D 11/00* (2006.01)

(52) U.S. Cl.
CPC .. *H01L 27/14625* (2013.01); *H01L 27/14636* (2013.01); *H01L 27/14643* (2013.01); *H01L 27/14698* (2013.01); *H04N 5/2251* (2013.01); *H04N 5/2253* (2013.01); *H04N 5/2254* (2013.01); *H04N 5/2257* (2013.01); *H04N 2005/2255* (2013.01); *Y10T 29/53* (2015.01); *Y10T 83/04* (2015.04); *Y10T 156/1052* (2015.01)

(58) Field of Classification Search
CPC ....... G02B 3/0056; G02B 3/0062; B26F 1/38; B29D 11/00298; H01L 27/14685; H01L 27/14625; H01L 27/14636; H01L 27/14643; H01L 27/14698; H04N 2005/2255; H04N 5/2251; H04N 5/2253; H04N 5/2254; H04N 5/2257; Y10T 156/1052; Y10T 29/53; Y10T 83/04
USPC .................. 483/68; 83/13; 359/619
See application file for complete search history.

(56) References Cited

U.S. PATENT DOCUMENTS

| | | | |
|---|---|---|---|
| 7,196,391 | B2 | 3/2007 | Hsieh |
| 7,384,809 | B2 | 6/2008 | Donofrio |
| 7,704,418 | B2 | 4/2010 | Rudmann et al. |
| 8,133,428 | B2 | 3/2012 | Kaida et al. |
| 8,638,500 | B2 | 1/2014 | Gallagher et al. |
| 2004/0190159 | A1 | 9/2004 | Hasegawa |
| 2005/0267328 | A1 | 12/2005 | Blumzvig et al. |
| 2006/0132644 | A1 | 6/2006 | Shangguan et al. |
| 2007/0230948 | A1 | 10/2007 | Hsiao-Wen et al. |
| 2008/0051637 | A1 | 2/2008 | Andreassen et al. |
| 2008/0225390 | A1* | 9/2008 | Chang ............. B29D 11/00365 359/558 |
| 2008/0252760 | A1 | 10/2008 | Wu |
| 2008/0290435 | A1 | 11/2008 | Oliver et al. |
| 2009/0244259 | A1 | 10/2009 | Kojima et al. |
| 2010/0045845 | A1 | 2/2010 | Yoneyama |
| 2010/0079635 | A1 | 4/2010 | Yano et al. |
| 2010/0165134 | A1* | 7/2010 | Dowski, Jr. ............. B24B 13/06 348/218.1 |
| 2010/0177237 | A1 | 7/2010 | Ryu |
| 2010/0246020 | A1 | 9/2010 | Wolterink et al. |
| 2010/0284089 | A1 | 11/2010 | Shyu et al. |
| 2010/0321564 | A1* | 12/2010 | Feldman .................. G02B 9/12 348/374 |
| 2011/0002053 | A1 | 1/2011 | Ovrutsky et al. |
| 2011/0009752 | A1 | 1/2011 | Chen et al. |
| 2011/0063428 | A1* | 3/2011 | Sonnenschein .... A61B 1/00096 348/76 |
| 2011/0222171 | A1* | 9/2011 | Kintz ............... B29D 11/00365 359/738 |

OTHER PUBLICATIONS

TW Patent Application No. 101108724—Taiwanese Office Action and Search Report, with English Translation, dated Apr. 18, 2014 (7 pages).
Fraunhofer IZM, "Cameras out of the salt shaker" http://izm.fraunhofer.de/EN/news_events/news/KamerasausdemSalzstreuer.jsp, Mar. 2011, 2 pgs.
Omnivision, "CameraCube", http://www.ovt.com/technologies/technologyphp?TID=1, printed Feb. 7, 2011, 4 pgs.
Omnivision, "OVM7690 640x480 CameraCube device product brief", 2 pgs.
"Color Camera Cubes", http://www.optoiq.com/optoiq-2/en-us-index/machine-vision-imaging-processing/display/vsd-articles-tools-template.articles.vision-systems-design.volume-15.issue-11.Features.color-camera-cubes.html, 7 pgs., printed on Feb. 25, 2011.
Ralph Zoberbier, "Technology Trends in Manufacturing and Packaging of Wafer Level Cameras" Electronic System Technology Conference (ESTC), 2010 3rd, pp. 1, 5, Sep. 13-16, 2010.
Han et al. "Wafer Level Camera Technology from Wafer Level Packaging to Wafer Level Integration", Electronic Packaging Technology & High Density Packaging, 2010 11th International Conference, pp. 121, 124, Aug. 16-19, 2010.

* cited by examiner

MINIATURE WAFER-LEVEL CAMERA MODULES

CROSS-REFERENCE TO RELATED APPLICATIONS

This application is a divisional of U.S. patent application Ser. No. 13/071,892, filed 25 Mar. 2011 and still pending, and claims priority therefrom under 35 U.S.C. §120. The priority application is hereby incorporated by reference in its entirety.

BACKGROUND

Field

Embodiments of the invention pertain to camera modules or to methods of manufacturing camera modules. In particular, embodiments of the invention pertain to miniature wafer-level camera modules or to methods of manufacturing miniature wafer-level camera modules.

Background Information

A representative manufacturing process for conventional camera modules may include manufacturing individual lenses one at a time or in small groups, but not through a wafer-level manufacturing process. In conventional camera modules, the individual lenses are assembled and attached to individual image sensor arrays. For example, one or more individual lenses may be assembled with a lens barrel or other lens holder, the lens barrel or holder may be assembled with a lens mount, and the lens mount may be mounted on a printed circuit board or flex substrate on which the individual image sensor array has been mounted. Other individual components such as filters, readout electronics, and the like, may similarly be individually assembled together to form the conventional camera module. This manufacturing process has certain drawbacks for certain implementations. In particular, the manufacturing process used for conventional camera modules tends to impose certain limits on the size and/or manufacturing cost achievable for these conventional camera modules. Moreover, conventional manufacturing processes are not able to benefit from the economies of scale and potential cost savings associated with wafer-level manufacturing processes.

BRIEF DESCRIPTION OF THE SEVERAL VIEWS OF THE DRAWINGS

The invention may best be understood by referring to the following description and accompanying drawings that are used to illustrate embodiments of the invention. In the drawings.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

Wafer-level camera modules provide an alternative to conventional camera modules and can be manufactured at sizes and/or manufacturing costs below those typically achievable for conventional camera modules. As the name suggests, wafer-level camera modules may be manufactured by a process that incorporates one or more wafer-level manufacturing operations. As in conventional camera module manufacture, the image sensor arrays are typically manufactured in parallel, at the wafer-level. However, in contrast to conventional camera module manufacture, the lenses used for wafer-level camera modules are also commonly manufactured at the wafer-level. A lens wafer may be manufactured and may have an array of individual lenses or an array of stacked lenses each having two or more lenses. The stack of lenses are substantially vertically aligned with one over the other(s) and as used herein stacked may mean but does not necessarily mean that a lens is stacked on top of a spacer (e.g., a stack of two lenses may include a first lens on a first side of a substrate and a second lens on a second, opposite side of the substrate.) By way of example, the lens wafer may have a numerous lenses or stacks of lenses (e.g., from hundreds to many thousands) Similarly, other components like filters, readout electronics, and the like, may potentially be manufactured at the wafer-level. Moreover, whereas conventional camera modules often have a plastic barrel to hold components together, wafer-level camera modules may be diced after stacked. Thus, wafer-level camera modules can be, and often are, more compact than conventional camera modules. In applications where compact size is advantageous, such as, for example, in various different types of small form factor endoscopes, the compact size of wafer-level camera modules provides a significant advantage. Therefore, techniques capable of further improving the compactness of wafer-level camera modules are advantageous and useful. In addition, the wafer-level processing typically allows the manufacturing costs of the wafer-level camera modules to be low, which benefits disposable or limited-use applications and other applications where low-cost miniature camera modules are desirable.

Figure 1:
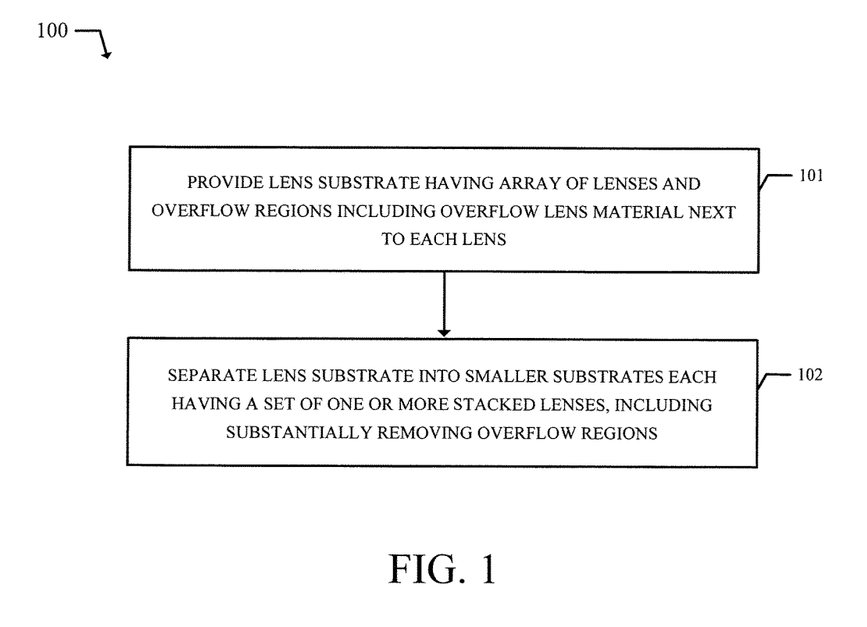
FIG. 1 is a block flow diagram of an example embodiment of a method of separating a lens wafer or other lens substrate having an array of lenses into multiple lens dice or other smaller lens substrates that each have a single lens or stack of two or more lenses.

FIG. 1 is a block flow diagram of an example embodiment of a method 100 of separating a lens wafer or other lens substrate having an array of lenses into multiple lens dice or other smaller lens substrates that each have a single lens or stack of two or more lenses. In some embodiments, the method may be performed as a part of a method of making wafer-level camera modules. In other embodiments the method may be performed separate from the manufacture of wafer-level camera modules.

Initially, the lens wafer or other larger lens substrate may be provided, at block 101. As used herein, providing a wafer or other substrate is to be interpreted broadly to encompass making the wafer or other substrate, buying, trading for, commissioning, or otherwise acquiring the wafer or other substrate, or otherwise obtaining the wafer or other substrate. The lens wafer or other larger lens substrate has the array of lenses. As used herein the term "array" encompasses, but does not necessarily imply, a reticulated grid or row-and-column arrangement of lenses. Next to each of the lenses of the array is a corresponding overflow region of the substrate. Typically included within each of the overflow regions is an overflow lens material, although some regions may possibly omit an overflow lens material.

Referring again to FIG. 1, the lens wafer or other larger lens substrate may be separated into multiple lens dice or other smaller lens substrates at block 102. The separation may be performed by dicing, singulation, sawing, cutting, or the like. Each of the lens dice or other smaller lens substrates has a single lens or stack of two or more lenses. In accordance with some embodiments, the separation at block 102 may include removing or substantially removing the overflow regions and/or overflow lens material of the lens wafer or other larger lens substrate which are next to each of the lenses of the array. As used herein, "substantially removing" the overflow regions and/or overflow lens material includes removing at least 60% of the overflow regions and/or overflow lens material. As used herein, "removing" the overflow regions and/or overflow lens material includes removing at least 80% of the overflow regions and/or overflow lens material. Other embodiments may remove at least 50%, at least 40%, at least 30%, or some other amount.

Advantageously, as will be explained further below, the removal or substantial removal of the overflow regions and/or overflow lens material may help to reduce the lateral area or footprint of the lens dice, singulated lenses, or other smaller lens substrates. While the scope of the invention is not limited to making small lens die and/or wafer-level camera modules, one potential advantage of removing or substantially removing the overflow region and/or the overflow lens material is enhanced ability to manufacture extremely small sized lenses and/or wafer-level camera modules.

Figure 2A:
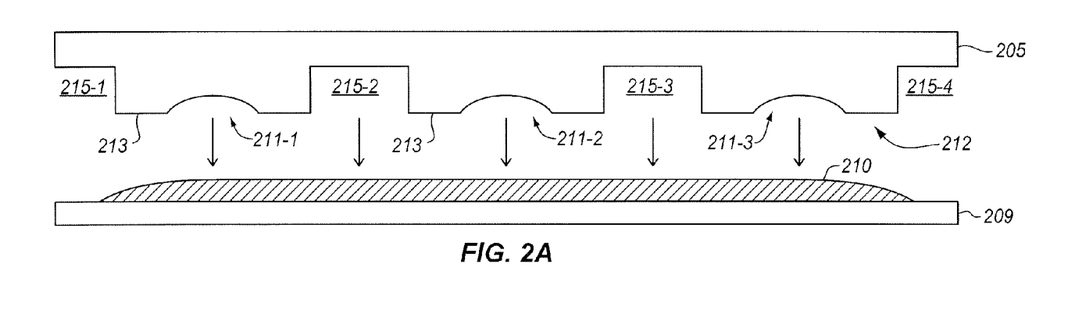
FIGS. 2A-C are schematic cross-sectional views illustrating an example embodiment of a method of making a lens wafer or other larger lens substrate having an array of lenses by molding with a lens molding master, and separating the lens wafer or other larger lens substrate into multiple lens dice or other smaller lens substrates.
Figure 2B:
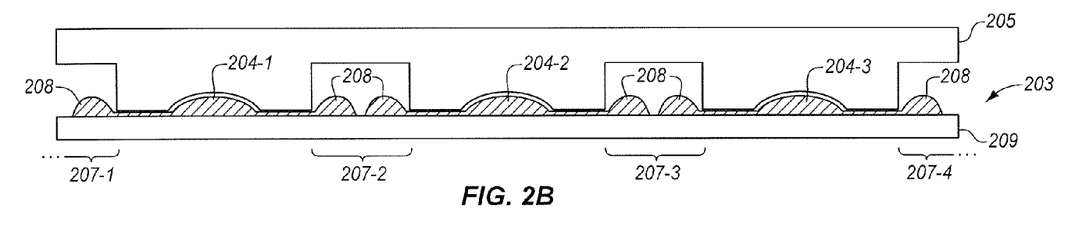
Figure 2C:
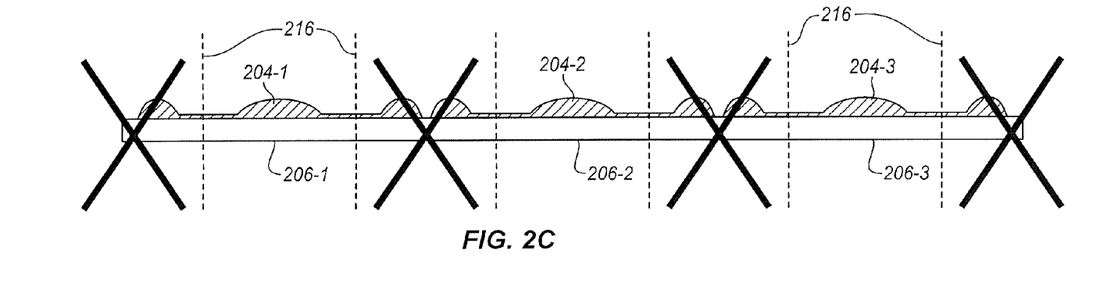

FIGS. 2A-C are schematic cross-sectional views illustrating an example embodiment of a method of making a lens wafer or other larger lens substrate 203 having an array of lenses 204-1, 204-2, 204-3 by molding with a lens molding master 205, and separating the lens wafer or other larger lens substrate 203 into multiple lens dice or other smaller lens substrates 206-1, 206-2, 206-3. In accordance with some embodiments, separating the lens wafer or other larger lens substrate into multiple lens dice or other smaller lens substrates may include removing or substantially removing overflow regions 207-1, 207-2, 207-3, 207-4 and/or overflow lens material 208 of the lens wafer or other larger lens substrate 203 which are next to and which correspond to each of the lenses of the array.

FIG. 2A illustrates a first stage of the illustrated method in which the lens molding master 205 is aligned above a substrate 209 with the liquid lens material 210 disposed between the lens molding master and the substrate. In the illustrated embodiment, the liquid lens material is disposed on the substrate. For example, the liquid lens material may be dispensed, spread, deposited, spin-coated, or otherwise applied or introduced onto the substrate. Alternatively, in another embodiment, the liquid lens material may be disposed on the lens molding master. For example, discrete drops, beads, or other discrete portions of the liquid lens material may be dispensed, deposited, applied, injected, or otherwise introduced into the lens cavities 211-1, 211-2, 211-3 of the lens molding master. The substrate 209 may be a glass substrate, a transparent plastic substrate, another type of optically transparent substrate, or another type of substrate suitable for manufacturing the molded lens substrate 203. By way of example, the liquid lens material 210 may be a thin layer of a liquid polymerizable material having monomer reactants and/or capable of undergoing polymerization reactions. Particular examples of suitable liquid lens materials include, but are not limited to, liquid epoxy materials, light or radiation curable monomer containing optical materials, and other liquid lens materials suitable for manufacturing molded lenses.

In various embodiments, the lens molding master 205 may be a hard stamp (e.g., made of a glass or other hard or inflexible material) or a soft stamp (e.g., made of polydimethylsiloxane (PDMS), silicon rubber, or other soft, flexible, or rubbery materials). The lens molding master has a lens molding surface 212 having an array of lens cavities 211-1, 211-2, 211-3 defined in the lens molding master. Each of the lens cavities has a recessed surface or structure having a shape of a lens intended to be molded by the lens cavity (e.g., a concave, hemispherical, or other lens-shaped surface). Around or potentially surrounding each of the lens cavities are flat contact surfaces 213. The flat contact surfaces are substantially coplanar with one another and are designed to contact the substrate 209 when the lens molding master 205 is brought into contact with the substrate 209 and pressure is applied. As shown, the region between the lens and the overflow accumulation regions may be designed to be flat to allow spacers to be seated on and bonded with the flat region. If desired, spacers (not shown) may be stacked on this flat region, such as, for example, to provide multiple layers of lenses. Defined in the lens molding master, and aligned above respective ones of overflow accumulation regions 207-1 through 207-4 to be discussed further below, are overflow accumulation cavities 215-1, 215-2, 215-3, 215-4. Each of the overflow accumulation cavities has (in cross-section) a rectangular, square, circular, irregular, or any other suitable shape, and has a size sufficient to provide a recess into which a portion of the liquid lens material may be forced, displaced, or otherwise caused to overflow on the overflow accumulation regions 207-1 through 207-4. In the illustrated embodiment, relatively large sized overflow accumulation cavities are shown, although the use of such large sized overflow accumulation cavities is not required. The lens molding master may be moved in the direction of the vertical downward arrows and pressed against the substrate.

FIG. 2B illustrates a second stage of the method in which the lens molding master 205 is pressed against the substrate 209 with the liquid lens material 210 disposed between the lens molding master and the substrate. The flat contact surfaces 213 are pressed substantially flat against the upper surface of the substrate (e.g., very close to one another with a residual amount of liquid lens material disposed between them). As the lens molding master is pressed or forced against the substrate, the liquid lens material flows and conforms to the shape of the molding surface 212 of the lens molding master, as illustrated. The liquid lens material has filled the array of lens cavities 211-1, 211-2, 211-3. The liquid lens material may be cured or hardened while the lens molding master remains in contact with the liquid lens material. In various embodiments, depending upon the particular liquid lens material, the curing or hardening of the liquid lens material may be achieved through exposure to ultraviolet light or other actinic radiation, through heating of the liquid lens material, or by allowing a sufficient amount of time for hardening. Then, the lens molding master may be separated from the substrate leaving an array of individual hardened lenses on the substrate. The substrate having the array of lenses represents a lens wafer or lens substrate having an array of lenses fabricated at the wafer-level.

Typically, the manufacture of lens wafers by molding with a lens molding master involves the application of excess liquid lens material, in excess of that needed to just fill the lens cavities. This excess helps to avoid incompletely filled lens cavities and/or the formation of voids in the lenses and/or helps to improve the formation of the lenses. As shown in the illustration, during the molding operation the excess liquid lens material is forced, displaced, or otherwise overflows into overflow accumulation regions 207-1, 207-2, 207-3, 207-4 as overflow portions 208 of the liquid lens material. Each of the overflow accumulation regions is next to, and corresponds to, one of the lenses 204-1, 204-2, 204-3. Notice that the excess liquid lens material has flow in the lateral dimension, in the plane of the lens wafer, into these overflow accumulation regions or yards. If the molded lens wafer were viewed from above (i.e., a top view), the overflow accumulation regions may partially or completely surround each of the corresponding lenses with the corresponding lens toward the center of each of the overflow accumulation regions. The overflow accumulation regions are also occasionally know in the arts as "yards." Commonly, design rules or heuristics prescribe that a size of an overflow accumulation region or yard should be sufficient to be able to accommodate a given percentage of the volume of the corresponding lens. This percentage tends to vary inversely with the size of the lens. Representatively, by way of example and not limitation, an example design rule may prescribe that a lens for a miniature wafer-level camera module have an associated overflow region that is able to accommodate somewhere in the range of 10-40% of the volume of the lens. Generally the smaller the lens, the greater the percentage of the volume of the lens allocated for overflow. For extremely small lenses, it is not uncommon for the overflow accumulation region to be sized to accommodate around 30-40%, or more, of the volume of the lens.

One potential drawback, depending upon the particular implementation, is that the overflow portions and/or the overflow accumulation regions tend to consume additional lateral area or footprint on the lens wafer. For relatively larger camera modules, since the area of the image sensor array tends to be sufficiently small compared to the area of the camera module package, this additional lateral area or footprint due to the overflow accumulation regions may be acceptable. However, for relatively smaller camera modules, for camera modules having high fill factors, and for camera modules where the area of the image sensor array is relatively high compared to the area of the camera module package, this additional lateral area or footprint due to the overflow accumulation regions may be undesirable. As used herein, the fill factor represents the percentage of the image sensor array lateral area to the camera module package lateral area. According to conventional wafer-level camera module manufacture technologies, if the area of the camera module package is not sufficient to accommodate the area of the image sensor array plus the associated overflow accumulation regions then the overflow volume design rule tolerances may need to be reduced, which may reduce lens quality and/or lens yields, or it may not otherwise be possible to form the camera module package as small as desired utilizing this molding with overflow approach. This limitation tends to be especially problematic for extremely small wafer-level camera modules where package sizes should be small and design rules prescribe relatively larger overflow accumulation regions. Some embodiments of the invention include removing or substantially removing an overflow accumulation region and/or overflow lens material.

FIG. 2C illustrates a third stage of the illustrated method in which the lens wafer or other larger lens substrate 203 is separated into multiple lens dice or other smaller lens substrates 206-1, 206-2, 206-3. The separation may be performed by dicing, singulation, sawing, cutting, or the like. Vertical dashed lines 216 delineate regions marked by "X" which may be removed or discarded. As shown, in accordance with some embodiments, the separation of the larger lens substrate into multiple lens dice or other smaller lens substrates may include removing or substantially removing the overflow regions and/or overflow lens material of the lens wafer or other larger lens substrate which are next to each of the lenses of the array. By enabling excess polymer to flow into regions of the wafer that can then be diced away, high-fill factor solutions can be achieved. The regions of the wafer having these overflows of the excess lens material may simply be scrapped and do not appear in the final module. This approach may also allow a smaller footprint to be achieved than can be achieved for other lens molding architectures such as a suspended lens architecture, since overflow may occur outside of the final perimeters of the device and be discarded.

In various embodiments, either one or multiple dicing cuts, singulation cuts, saw cuts, or other cuts may be made between a pair of adjacent lenses to separate the lenses and remove or substantially remove the overflow regions and/or overflow lens material. For example, in one embodiment, a single dicing cut may both separate and remove or substantially remove the overflow regions and/or overflow lens material between the pair of adjacent lenses. The illustrated embodiment shows one example amount of the overflow regions and/or overflow lens material that may be removed, although other embodiments may remove either more or less of the overflow regions and/or overflow lens material. For example, if a smaller lens is desired, even more of the flat regions corresponding to the flat contact surfaces 213 may optionally be removed. In addition, in the illustrated embodiment, each of the lens dice or other smaller lens substrates has a single lens, although in other embodiments each may have a stack of two or more lenses. In one aspect, each of the lenses may be molded similarly to the lenses 204-1, 204-2, 204-3 in additional molding operations. Methods of forming stacked lenses by molding are known in the arts. In one aspect, different architectures, such as, for example, a layered lens architecture, a hybrid architecture involving a lens similar to that discussed above in combination with a lens having a lens-in-a-pocket architecture, or other architectures, may optionally be used.

Advantageously, the removal or substantial removal of the overflow regions and/or overflow lens material may help to reduce the lateral area or footprint of the lens dice, singulated lenses, or other smaller lens substrates. While the scope of the invention is not limited to making small lens die and/or wafer-level camera modules, one potential advantage of removing or substantially removing the overflow region and/or the overflow lens material is enhanced ability to manufacture extremely small sized lenses and/or wafer-level camera modules. The scope of other embodiments is not limited to making lenses of any particular size.

Figure 3:
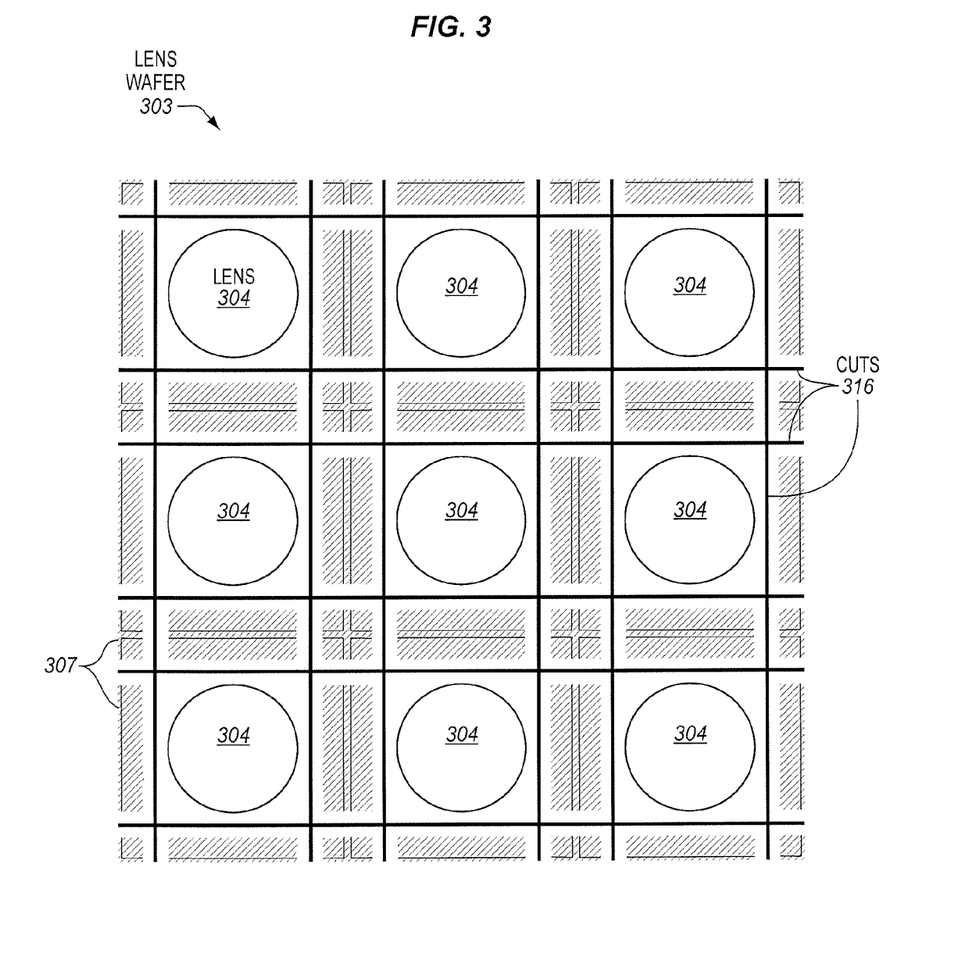
FIG. 3 is a top view of a lens wafer having an array of lenses.

FIG. 3 is a top view of a lens wafer 303 having an array of lenses 304. In the illustration, nine lenses are shown on the lens wafer, although commonly many more lenses may be included on a lens wafer. Around and surrounding each of the lenses are an example embodiment of overflow regions or yards 307. The illustrated overflow regions or yards are defined between inner squares representing inner perimeters and outer squares representing outer perimeters, where a single corresponding lens is approximately centered within each of the inner and outer squares. It is to be appreciated that other than square yards are also suitable (e.g., rectangular, circular, oval, etc.). An example embodiment of dicing lines 316 representing where dicing cuts may be made to separate the lens wafer into lens dice is shown. In the illustrated embodiment, two dicing lines are used between each pair of adjacent lenses to separate the lenses and remove or substantially remove the overflow regions/yards and/or any overflow lens material that would flow into the overflow accumulation regions/yards. Alternatively, a single much wider cut may be used between each pair of adjacent lenses to both separate the lenses and remove or substantially remove the overflow regions/yards and/or any overflow lens material.

Commonly, at least some of the assembly of wafer-level camera modules is also performed at the wafer-level. In one approach, the image sensor array wafer and the lens wafer may be aligned such that each image sensor array and each corresponding set of one or more lenses are aligned relative to one another, and then wafer bonded together. Then, the bonded wafers may be diced, singulated, or otherwise separated into wafer-level camera modules each having an image sensor array and one or more corresponding lenses. In this first approach, the lenses and image sensor arrays are bonded or combined at the wafer-level. In another approach, the lens wafer may first be diced, singulated, or separated into lens dice each having one lens or a stack of lenses. Each of these lens dice may be aligned and bonded with a corresponding image sensor array of the image sensor array wafer. Then, the image sensor array wafer having the lens dice bonded thereto may be diced, singulated, or otherwise separated into wafer-level camera modules each having an image sensor array and one or more corresponding lenses. Dicing the lens wafer before dicing the image sensor array wafer may offer an advantage when the yield of acceptable lenses is greater than the yield of acceptable image sensor arrays, for example.

Figure 4:
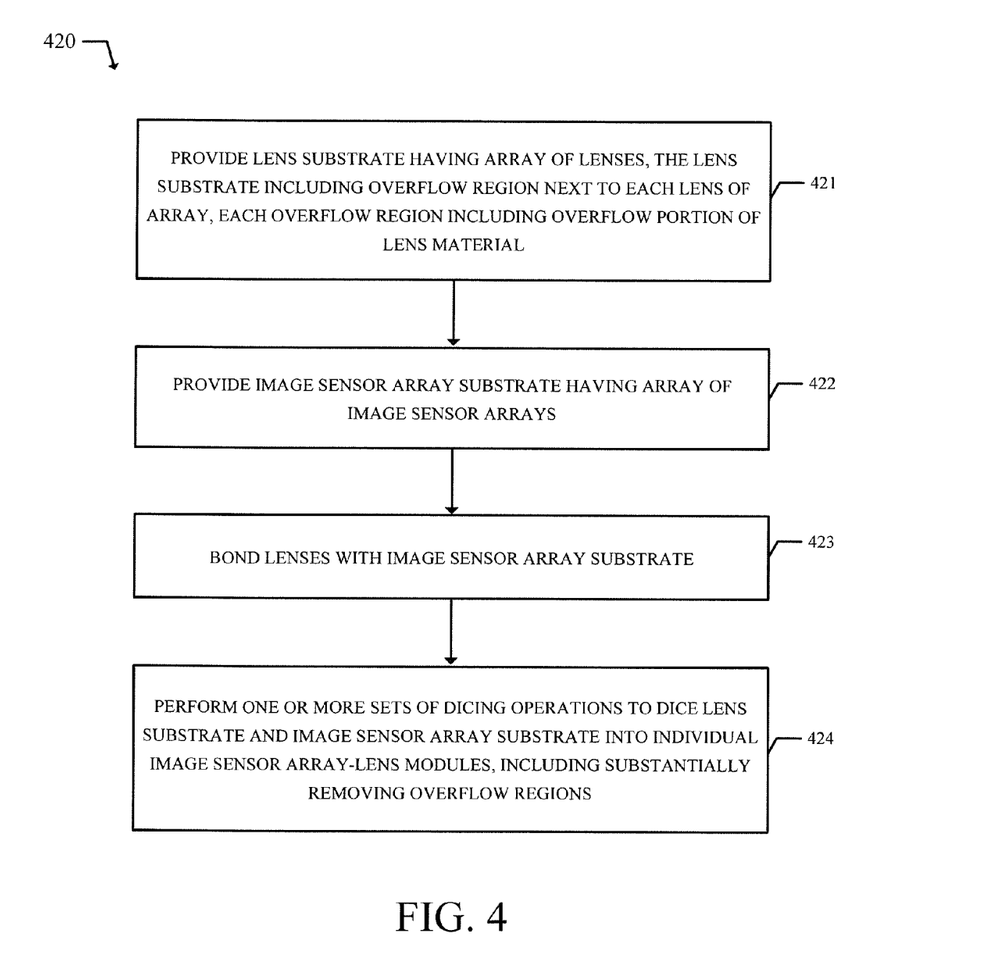
FIG. 4 is a block flow diagram of an example embodiment of a method of manufacturing image sensor array-lens modules for wafer-level camera modules.

FIG. 4 is a block flow diagram of an example embodiment of a method 420 of manufacturing image sensor array-lens modules for wafer-level camera modules. A lens wafer or other substrate having an array of lenses is provided, at block 421. The lens substrate has an overflow accumulation region next to each lens of the array. For example, each overflow accumulation region may at least partially or completely surround a corresponding lens. Each overflow accumulation region has an overflow portion of lens material. An image sensor array wafer or other substrate having an array of image sensor arrays is also provided, at block 422. In some embodiments, the image sensor array wafer may use through-silicon vias or through-sensor vias (TSVs). A TSV is a via or other vertical electrical interconnect that passes completely through a silicon wafer or die or image sensor array wafer or die. The TSVs may allow for electric connections between sensor pads and a ball grid array without having to dice the sensors, although this is not required. As before, providing these wafers or substrates may include making, buying, or otherwise obtaining these wafers or substrates. The lenses are bonded with the image sensor array substrate, at block 423. Different ways in which this may be done will be discussed further below in conjunction with FIGS. 5-6. One or more dicing operations are performed to dice the lens substrate and the image sensor array substrate into individual image sensor array-lens modules, at block 424. Each image sensor array-lens module has an image sensor array and one or more corresponding lenses. In some embodiments, performing the one or more dicing operations includes removing or substantially removing the overflow accumulation regions and/or overflow lens material.

Figure 5:
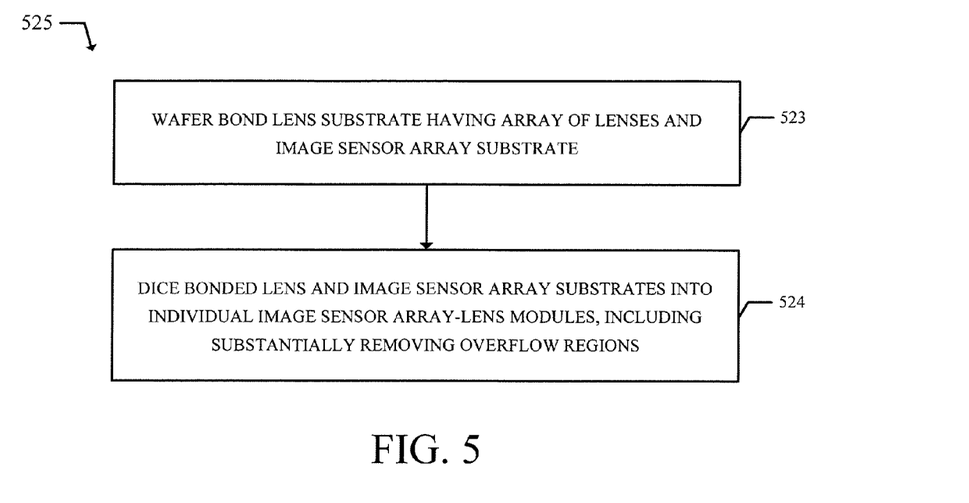
FIG. 5 is a block flow diagram of a first example embodiment of a method of bonding lenses with an image sensor array substrate and performing one or more dicing operations to dice the lens substrate and the image sensor array substrate.
Figure 6:
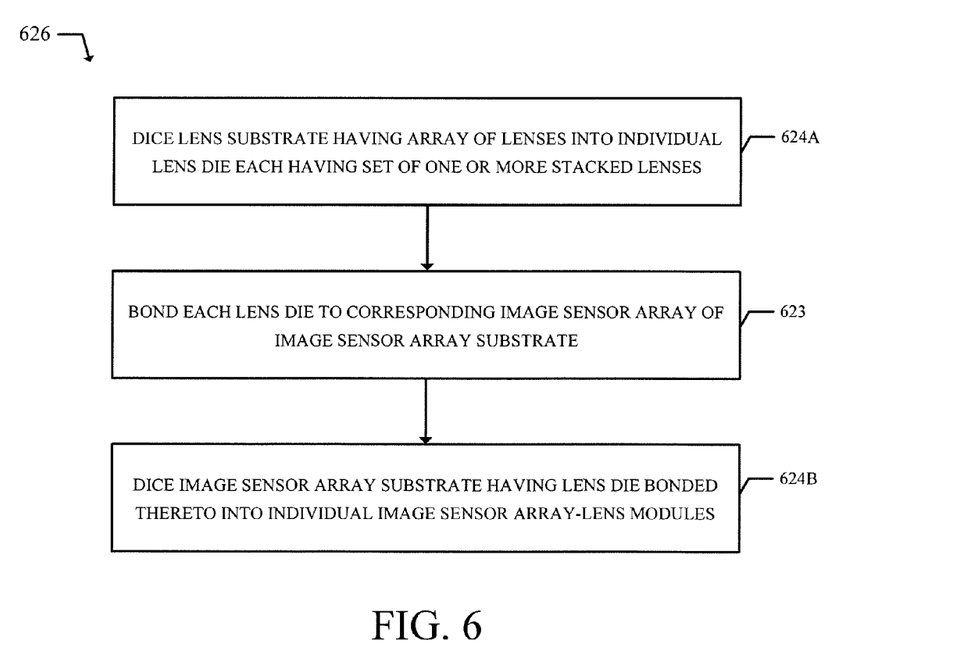
FIG. 6 is a block flow diagram of a second example embodiment of a method of bonding lenses with an image sensor array substrate and performing one or more dicing operations to dice the lens substrate and the image sensor array substrate.

The method of FIG. 4 encompasses different approaches for bonding according to block 423 and dicing according to block 424. FIG. 5-6 illustrate different approaches for bonding according to block 423 and dicing according to block 424 that are encompassed by the method of FIG. 4.

FIG. 5 is a block flow diagram of a first example embodiment of a method 525 of bonding lenses with an image sensor array substrate and performing one or more dicing operations to dice the lens substrate and the image sensor array substrate. The lens substrate having the array of lenses and the image sensor array substrate having the array of image sensor arrays are aligned and wafer bonded, at block 523. Individual lenses or lens stacks each having two or more stacked lenses may be aligned and bonded over corresponding individual image sensor arrays. Then, the bonded lens and image sensor array substrates may be diced into individual image sensor array-lens modules at the wafer-level, at block 524. In some embodiments, the dicing of the bonded lens and image sensor array substrates may include removing or substantially removing the overflow accumulation regions and/or overflow lens material.

FIG. 6 is a block flow diagram of a second example embodiment of a method 626 of bonding lenses with an image sensor array substrate and performing one or more dicing operations to dice the lens substrate and the image sensor array substrate. The lens substrate having the array of lenses may be diced, singulated, or separated into individual lens die, with each lens die having a single lens or a lens stack having two or more stacked lenses, at block 624-A. In one or more embodiments, the dicing, singulating, or separating of the lens substrates at block 624-A includes removing or substantially removing the overflow accumulation regions and/or overflow lens material. Then, each lens die or singulated set of one or more lenses may be aligned and bonded at the die-level with a corresponding image sensor array of the image sensor array substrate, at block 623. Then, the image sensor array substrate having the lens die bonded thereto may be separately diced, singulated, or separated into individual image sensor array-lens modules, at block 624-B. In one or more embodiments, the dicing, singulating, or separating of the image sensor array substrate at block 624-B includes removing or substantially removing the overflow accumulation regions and/or overflow lens material. In still other embodiments, the removal or the substantial removal of the overflow accumulation regions and/or overflow lens material is performed partially at block 624-A and partially at block 624-B.

Figure 7:
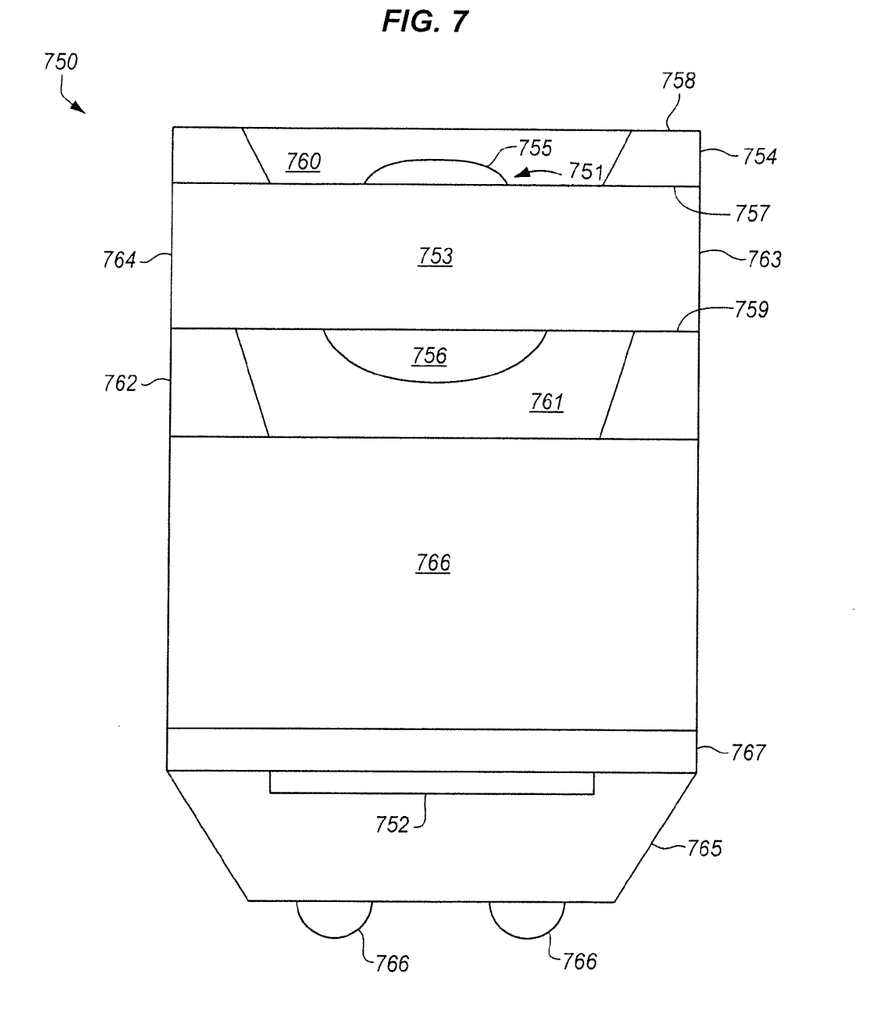
FIG. 7 is a cross-sectional view of an example embodiment of a miniature camera module.

FIG. 7 is a cross-sectional view of an example embodiment of a miniature camera module 750. In various embodiments, the camera module may have a maximum lateral area or cross section (which as viewed is a horizontal plane into the page), which has a size that is less than 1.3 mm×1.3 mm, or less than 1.2 mm×1.2 mm, or less than 1.1 mm×1.1 mm, or less than 1.0 mm×1.0 mm, or less than 0.9 mm×0.9 mm, or less than 0.8 mm×0.8 mm, or less than 0.25 mm×0.25 mm.

The miniature camera module has an aperture 751. During operation, the aperture 751 is operable to receive light from an external environment surrounding the miniature camera module. The aperture represents a region through which light is able to enter the miniature camera module and helps to determine the angle of light rays received into the camera module that are to be focused onto an image sensor array 752. If the miniature camera module were viewed from above, the aperture 751 of one embodiment may represent a generally circular opening, or optically transparent region, within a surrounding optically non-transparent layer, coating, or material (not shown) formed over a top surface 757 of a first glass or other transparent substrate 753 and over a top surface 758 of a glass or other protective mechanical spacer 754. By way of example, the non-transparent layer, coating, or material may be a black material (e.g., a black yard mask), a reflective material (e.g., a metal layer), or other non-optically transparent materials capable of blocking incident light. Light from the external environment may only enter the miniature camera module through the aperture 751.

The miniature camera module has either a single lens or two or more stacked lenses 755, 766. The single lens or the stack of the two or more lenses is optically coupled to receive the light from the aperture 751. The single lens or the stack of the two or more lenses is operable to optically focus the received light. In various embodiments, the camera module may have no more than four, no more than three, or only two focusing surfaces. The focusing surfaces may represent curved surfaces of one or more lenses that are capable of focusing light. Having fewer focusing surfaces tends to reduce the size and/or manufacturing costs.

The illustrated embodiment of the miniature camera module includes a stack of a first, smaller lens 755 on the top surface 757 of the first glass or other transparent substrate 753. The first, smaller lens 755 is included within an opening 760 in the glass or other protective mechanical spacer 754. The opening 760 may be laser drilled, mechanically drilled, etched, or otherwise formed in the spacer 754 and the spacer 754 may be coupled with the glass substrate or other transparent substrate 753 either at the wafer or die level. The first, smaller lens 755 is disposed over the aperture 751 and is substantially coextensive in lateral area with the aperture 751. The first, smaller lens has a flat, lower surface abutting the first glass or other transparent substrate 753, which is substantially aligned with and coextensive with the aperture 751. Around the flat, lower surface on the top surface 757 of the first glass or other transparent substrate 753 is the black yard mask, metal, or other non-optically transparent material to block light. Representatively, the black, metal, or other non-optically transparent material may be deposited, coated, or otherwise formed over the first glass or other transparent substrate 753 prior to molding the first, smaller lens 755 on the substrate 753. A top surface of the first, smaller lens 755 is curved and represents a first focusing surface. The first, smaller lens may receive light through the aperture and focus the received light.

The lens stack of the illustrated embodiment also includes a second, larger lens 756 on a bottom surface 759 of the first glass or other transparent substrate 753. The second, larger lens is included within an opening 761 in a second glass or other mechanical spacer 762. The opening 761 may be laser drilled, mechanically drilled, etched, or otherwise formed in the spacer 762 and the spacer 762 may be coupled with the glass substrate or other transparent substrate 753 either at the wafer or die level. The second, larger lens 756 is optically coupled to receive focused light from the first, smaller lens 755. The first lens 755 and the second lens 756 are substantially vertically aligned with one another. The second, larger lens 756 may be a landscape lens or a simple meniscus singlet having an upper, flat surface adjacent the lower surface 759 of the first glass or other transparent substrate 753. If desired, an infrared filter layer (not shown) may optionally be formed on the lower surface 759 of the first glass or other transparent substrate 756 prior to molding the second, larger lens thereto. The second, larger lens also has a lower, curved surface which may be a substantially steep convex surface. The lower, curved surface of the second, larger lens represents a second focusing surface. In some embodiments, one or more of the first and second lenses may be aspherical lenses operable to provide higher order aspherical components, and thus a combination of higher image quality or larger field of view (FOV).

In some embodiments the stack of the one or more lenses 755, 756 may be formed at the wafer-level using either a lens molding approach or a direct etching approach. Forming the lenses at the wafer-level and potentially using wafer-level processing tends to reduce the manufacturing costs. In the case of direct etching, a resist or other sacrificial material may first be patterned onto a substrate and then reflowed to form hemispherical or lens shapes. The wafers may then be plasma etched or otherwise etched to transfer the hemispherical or lens shapes of the sacrificial material into the underlying substrate. In the case of a lens molding approach, in some embodiments, a lens molding method similar to those discussed above may optionally be used, and when separating the lens wafer or other larger lens substrate into lens dice or other smaller lens substrates each having the stack of the one or more lenses, overflow regions or yards may be removed or substantially removed, as previously described. In the case of these embodiments, right and left (as viewed) vertical sidewall surfaces 763, 764 may represent diced, sawed, or cut surfaces where overflow regions and/or overflow materials have been diced, cut, or severed away. As another option, other lens architectures, such as, for example, a suspended lens architecture, a lens-in-a-pocket architecture, a hybrid architecture, or other architectures capable of providing miniature lenses, may optionally be used. In one embodiment, the lenses may be molded of an Ormocomp brand ultraviolet (UV) curable hybrid polymeric material. One advantage of Ormocomp brand polymeric material is that it is capable of withstanding solder reflow temperatures and/or solder reflow processes without compromising the optical performance of the lenses. Other polymeric lens materials known in the art to be capable of withstanding solder reflow temperatures and/or solder reflow processes may also optionally be used.

Referring again to FIG. 7, the miniature camera module has an image sensor array die 765 having an image sensor array 752. The image sensor array 752 is optically coupled to receive the focused light from the stack of the one or more lenses 755, 756. An image sensor cover glass or other glass or transparent substrate 766 is optically coupled between the second, larger lens 756 and the image sensor array die 765.

A so-called dam region 767 is coupled between the image sensor cover glass or other glass or transparent substrate 766 and the image sensor array die 765 and may provide air, atmosphere, or an inert gas (e.g., nitrogen gas) above the image sensor array. The image sensor array 752 is an active area of the die that is operable to sense light and produce electrical signals for imaging. In some embodiments, a lateral area of the image sensor array, which as viewed is a horizontal plane into the page, is less than 0.6 mm by 0.6 mm, less than 0.5 mm by 0.5 mm, or less than 0.4 mm by 0.4 mm. In one particular example embodiment, the image sensor array is an array of about 200×200 pixels, each pixel has about 1.75 micrometer pixel pitch with an active area diagonal of about 0.5 mm, and the image sensor array has a lateral area of about 0.35 mm×0.35 mm, although the scope of the invention is not so limited. Around the image sensor array is a peripheral region including circuitry. The image sensor array may be a complementary metal oxide semiconductor (CMOS) image sensory array, which may be either front side illuminated (FSI) or back side illuminated (BSI).

In some embodiments, the stack of the one or more lenses is operable to optically focus the light on the active area of the image sensor array to provide a working distance that is less than 50 millimeters (mm), less than 30 mm, less than 20 mm, or less than 15 mm, and often greater than about 5 mm. In some embodiments, the stack of the one or more lenses is operable to optically focus the light on the active area of the image sensor array to provide a field of view (FOV) of at least 70°, at least 75°, at least 80°, between about 75-85°, or an even greater field of view. In some cases, the working distance may be less than 20 millimeters and the field of view may be greater than 70°, and in certain cases the working distance may be less than 15 millimeters and the field of view may be greater than 75°. For small sized image sensor arrays, as few as two focusing surfaces may be operable to provide sufficient image quality at these fields of view and working distances. In some aspects, the two focusing surfaces may be provided by only one or only two lenses. Such a small number of lenses is advantageous in terms of cost and small form factor. Conventional non-wafer-level techniques of manufacturing lenses are typically not able to manufacture such small form factor lenses. Additionally, larger lenses manufactured by these conventional, non-wafer-level techniques are typically used with larger image sensors having larger image areas. This is not only disadvantageous from the point of view of form factor, but also because, due to the larger image area, six or more lenses are often needed to achieve equivalent image quality at similar ranges of working distances and field of view. Using six or more lenses tends to significantly increase the manufacturing cost.

The miniature camera module has interconnects 766 on an outside of the camera module housing to allow connection to an external signaling medium. As shown, in some embodiments the interconnects may include a ball grid array. In some embodiments, the miniature camera module may be a surface mount capable device that is capable of being surface mounted to an external signaling medium (e.g., a printed circuit board or flex substrate) for example with wire bonding or flip-chip techniques. Using such ball grid array for interconnection may help to reduce the size and manufacturing costs compared to those typically achievable if input/output pins and through-hole interconnection technologies were employed. Another option would be to use through silicon via technology.

The miniature lenses and/or miniature camera modules disclosed elsewhere herein may be used in a variety of different applications where there is a benefit to having miniature lenses and/or miniature camera modules. Examples of applications include, but are not limited to, mobile phones, laptop cameras, notebook webcams, surveillance devices, automotive camera applications, and medical imaging applications. To further illustrate certain concepts, further details of a medical imaging application in an endoscope will be described, although the scope of other embodiments are not limited to endoscopes.

Endoscopes are commonly used for medical imaging applications. Endoscopes are instruments or devices that may be inserted into a patient (human or animal) and used to look inside a body cavity, lumen, or otherwise look inside the patient. Various different types of endoscopes need to have a small lateral form-factor. For example, capsule endoscopes or pill endoscopes need to have a small lateral form factor so that they can be swallowed easily and without discomfort or risk of choking. As another example, various other different types of small form-factor endoscopes designed to be inserted into small body cavities, lumens, orifices, and the like, which should also be small so as to provide better maneuverability, fit in smaller spaces, and/or reduce patient discomfort.

Such small lateral form-factor endoscopes may benefit from small image sensors arrays. The image sensor arrays should provide sufficient image quality for the intended application and a sufficiently large field of view. Commonly, in endoscopes the field of view should be typically greater than 70°, often greater than 75°, and in many cases at least about 80°. To achieve the desired image quality and field of view, previously proposed camera modules for endoscopes included four or more lenses, which tends to increase the cost of manufacture of the camera modules. However, various embodiments of small wafer-level camera modules as disclosed elsewhere herein (e.g., the camera module 750 of FIG. 7) are able to achieve sufficient image quality and a sufficiently large field of view (e.g., greater than 70°, 75°, or 80°). In some embodiments, wafer-level optics, and substantially removing or removing overflow regions as disclosed herein, may be used to make the extremely small wafer-level camera modules. As a result, these miniature camera modules are useful in endoscopes. In some embodiments, these miniature camera modules achieve the field of view and image quality with only two lenses, which helps to keep the manufacturing costs low. Moreover, when lenses are manufactured at the wafer level, the typically large gross die per wafer (GDPW) counts resulting from the wafer-level optics also helps to reduce the manufacturing costs. These reduced manufacturing costs may offer a significant advantage when the camera modules are incorporated into disposable or limited use endoscopes, as well as in other applications where reducing the costs of the camera modules is highly advantageous.

Figure 8:
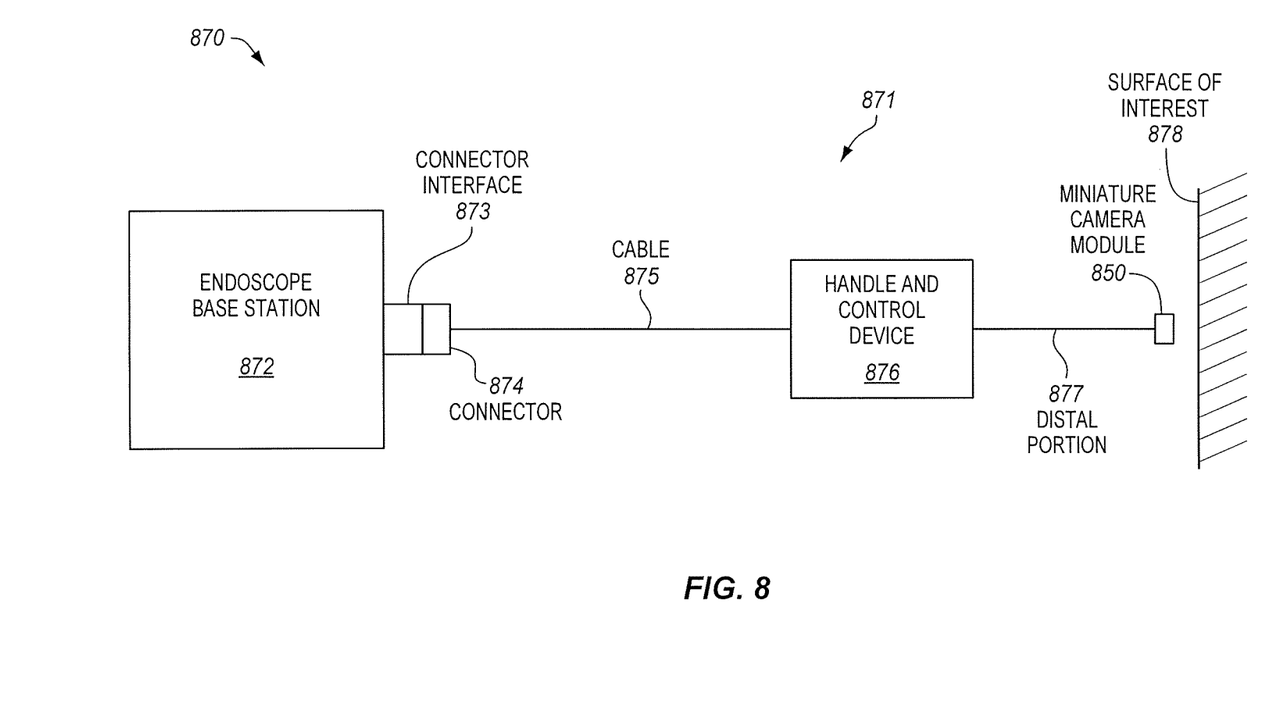
FIG. 8 is a block diagram of an example embodiment of an endoscope system including an endoscope and an endoscope base station, where the endoscope has an embodiment of a miniature camera module.

FIG. 8 is a block diagram of an example embodiment of an endoscope system 870 including an endoscope 871 having a miniature camera module 850. Examples of suitable types of endoscopes include, but are not limited to, bronchoscopes, colonoscopes, gastroscopes, duodenoscopes, sigmoidoscopes, ureteroscopes, sinuscopes, boroscopes, and thorascopes, to name just a few examples.

The endoscope system includes an endoscope base station 872 and the endoscope 871. The endoscope is connected to a connector interface 873 of the endoscope base station. In particular, a proximal portion of the endoscope has a connector 874 at an end of a cable 875. The connector 874 is connected to the connector interface 873. The connector may also be disconnected from the connector interface when the endoscope is not in use. The endoscope and the endoscope base station may be manufactured and sold separately, potentially by different vendors.

Attached to a distal end of the cable 875 is a handle and control device 876. The handle and control device may provide a handle that an operator of the endoscope may use to hold and maneuver the endoscope. The handle and control device may have varying levels of controls that the operator of the endoscope may use to control movement and functioning of the endoscope. A few representative examples include, but are not limited to, controlling movement of the endoscope, controlling lighting, controlling image acquisition, and controlling therapeutic functionalities of the endoscope (e.g., controlling a cutting device, deploying a balloon, etc.).

A distal portion 877 of the endoscope is coupled with the handle and control device 876. In some embodiments, the distal portion 877 may include a flexible cannula. In some embodiments, the distal portion 877 may be attachable and detachable to the handle and control device 876. In some embodiments, the endoscope 871 and/or the distal portion 877 may be a one-time use, limited use, or disposable endoscope and/or the distal portion. Embodiments of wafer-level camera modules disclosed herein, which may be manufactured at relatively low manufacturing costs due in part to the wafer-level processing and/or the surface mount interconnections, may be well suited for such one-time use, limited use, or disposable endoscopes.

At least a distal tip of the distal portion 877 is intended to be introduced into a body of a patient. For example, the distal tip of the distal portion may be introduced into a nose, ear, mouth, rectum, esophagus, vein, artery, or other body cavity or lumen. The distal tip of the distal portion may have a hermetically sealed housing having a transparent glass or transparent plastic window, lens, or other transparent portion. A light source may be enclosed within the hermetically sealed housing. The light source may be positioned to transmit light through the transparent portion of the housing. A miniature camera module 850 may also be coupled with the distal portion 877 of the endoscope. The miniature camera module 850 may be enclosed within the hermetically sealed housing. The miniature camera module positioned to receive light through the transparent portion of the hermetically sealed housing. The miniature camera module may be used to view or acquire images of a surface of interest 878 (e.g., a surface or feature inside a patients body).

The miniature camera module 850 may have any of the features of the miniature camera modules or miniature lenses disclosed elsewhere herein. For example, in various embodiments, the miniature camera module 850 may have a lens die or lens substrate made in accordance with the method of FIG. 1, the miniature camera module may be made in accordance with the method of FIG. 4, and/or the miniature camera module may have features of the miniature camera module of FIG. 7. Typically, in endoscope applications, the miniature camera modules may have a working distance that is less than 50 millimeters (mm), less than 30 mm, less than 20 mm, or less than 15 mm, and often greater than about 5 mm. Likewise, in endoscope applications, the stack of the one or more lenses of the miniature camera module may be operable to provide a field of view (FOV) of at least 70°, at least 75°, at least 80°, between about 75-85°, or an even greater field of view.

The miniature camera module 850 may offer certain potential advantages when used with the endoscope 871 and/or distal portion 877. For one thing, the miniature camera module typically has a small form factor as previously described. The small form factor of the miniature camera module may be used in small sized endoscopes that are capable of being introduced into small body cavities, lumens, or regions and/or that may help to reduce patient discomfort associated with larger sized endoscopes. For another thing, the miniature camera modules typically can be manufactured at relatively low costs, which may benefit use in disposable or limited use endoscopes (as well as other disposable or limited use devices).

The manufacturing cost of wafer-level manufacturing techniques depends not only on gross die per wafer (GDPW) but also on yields. To keep manufacturing costs low, it is desirable to have high GDPW, which is easily achievable when the form factor of the camera modules is small. For example, a sensor on the order of 1 mm×1 mm in an 8-inch wafer, for example, achieves a GDPW value on the order of tens of thousands of sensors per wafer.

Yields, on the other hand, depend in part on the number of process steps. Manufacturing processes having fewer steps tend to have fewer failure points and accordingly tend to have higher yields. Therefore, the manufacture of a camera module having only two stacked lenses instead of three, four, six, or more stacked lenses, offers manufacturing cost advantages not only because of the reduced number of materials and labor required for their manufacture, but also because of improved yields. The relative importance of yield tends to become increasingly greater as the GDPW increases.

Figure 9:
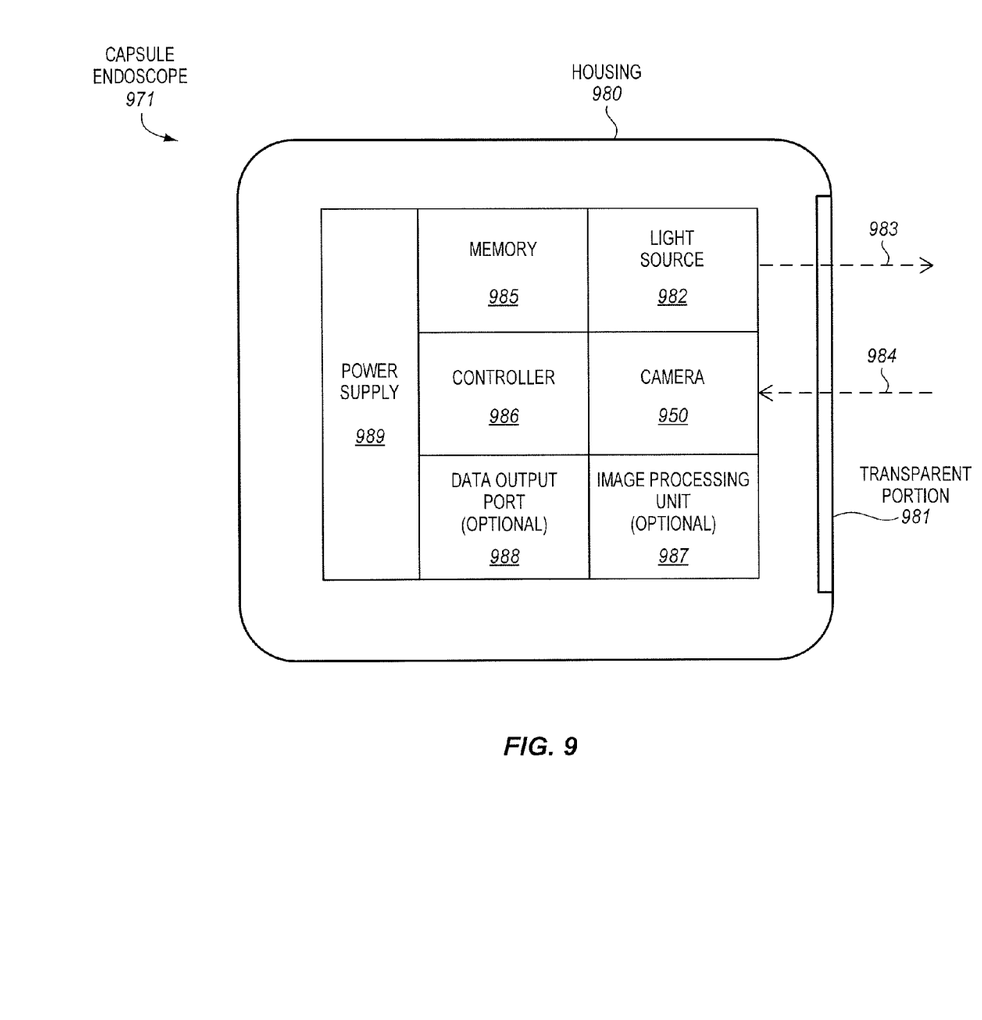
FIG. 9 is a block diagram of an example embodiment of a capsule endoscope having an embodiment of a miniature camera module.

FIG. 9 is a block diagram of an example embodiment of a capsule endoscope 971. The capsule endoscope is also sometimes known as a pill camera or pill cam. The capsule endoscope is to be interpreted broadly as a device that is sized and shaped such that it is capable of being swallowed and that includes a camera or imaging device to allow images of an inside of a patient to be acquired.

The capsule endoscope has a housing 980. The housing has a size and a shape that are capable of being swallowed by a patient. The term "capsule" is intended to cover any cylindrical, round, rounded, generally capsule-like, or generally pill-like shape as conventionally used for medicinal capsules or medicinal pills, or shapes used for prior art capsule endoscopes known in the arts. Commonly the housing is a hermetically sealed housing operable to provide varying amounts of a hermetic seal to allow the device to function as intended for the particular implementation.

The housing has a transparent portion 981 that is transparent to light 983, 984 that is to be passed through the transparent portion. By way of example, the transparent portion may include a glass or plastic window or lens. In the illustrated embodiment, the transparent portion comprises a transparent side, or portion of a side, of the housing.

A light source 982 is enclosed within the housing. The light source is positioned to transmit light 983 through the transparent portion of the housing. The light source may include one or more lights, such as, for example, various different types of light emitting diodes (LEDs), lasers (e.g., vertical-cavity surface-emitting lasers (VCSELs)), semiconductor lights, etc.

A miniature camera module 950 is also enclosed within the housing. The miniature camera module is positioned to receive light 984 through the transparent portion of the housing. The miniature camera module may have the features or characteristics of the camera modules disclosed elsewhere herein.

Commonly, the capsule endoscope may also have a memory 985 enclosed within the housing to store images obtained by the camera and optionally other data. Commonly, the capsule endoscope may also have a controller 986 and power supply 989 enclosed within the housing. The controller may control various different types of operations performed by the capsule endoscope. The power supply may provide power to the capsule endoscope. By way of example, the power supply may include a battery. In some cases, the capsule endoscope may have a data output port 988 operable to output images stored in the memory. Alternatively, the data output port may optionally be omitted, for example, if the device is a disposable device that may be broken or dissembled to recover the memory. In other cases the data output port may wirelessly transmit images and data out of the capsule and/or outside the body of the patient. In some cases, the capsule endoscope may have an optional image processing unit 987.

The terms "coupled" and "connected," along with their derivatives, may be used herein. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

In the description above, for the purposes of explanation, numerous specific details have been set forth in order to provide a thorough understanding of the embodiments of the invention. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known circuits, structures, devices, and operations have been shown in block diagram form or without detail in order to avoid obscuring the understanding of the description.

It will also be appreciated, by one skilled in the art, that modifications may be made to the embodiments disclosed herein, such as, for example, to the sizes, shapes, configurations, forms, functions, materials, and manner of operation, and assembly and use, of the components of the embodiments. All equivalent relationships to those illustrated in the drawings and described in the specification are encompassed within embodiments of the invention.

For simplicity and clarity of illustration, elements illustrated in the figures have not necessarily been drawn to scale. For example, the dimensions of some of the elements are exaggerated relative to other elements for clarity. Further, where considered appropriate, reference numerals or terminal portions of reference numerals have been repeated among the figures to indicate corresponding or analogous elements, which may optionally have similar characteristics.

Various operations and methods have been described. Some of the methods have been described in a basic form in the flow diagrams, but operations may optionally be added to and/or removed from the methods. In addition, while the flow diagrams show a particular order of the operations according to example embodiments, it is to be understood that that particular order is exemplary. Alternate embodiments may optionally perform the operations in different order, combine certain operations, overlap certain operations, etc. Many modifications and adaptations may be made to the methods and are contemplated.

It should also be appreciated that reference throughout this specification to "one embodiment", "an embodiment", or "one or more embodiments", for example, means that a particular feature may be included in the practice of the invention. Similarly, it should be appreciated that in the description various features are sometimes grouped together in a single embodiment, Figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. A manufacturing method for miniature wafer-level camera modules, the manufacturing method comprising:
   providing a lens substrate having an array of lenses, the lens substrate including an overflow region next to each lens of the array, each overflow region including an overflow lens material;
   providing an image sensor array substrate having an array of image sensor arrays;
   bonding the lens substrate with the image sensor array substrate; and
   separating the lens substrate and the image sensor array substrate into a plurality of smaller substrates, each of the smaller substrates having one of a single lens, a plurality of stacked lenses, and an image sensor array, wherein separating the lens substrate into the plurality of smaller lens substrates includes substantially removing the overflow regions,
   wherein separating the lens substrate into the smaller substrates comprises making two or more cuts between a pair of adjacent lenses to separate the lenses from one another and substantially remove overflow regions between the pair of adjacent lenses.

2. The method of claim 1 wherein separating the lens substrate into the smaller substrates comprises dicing the lens substrate.

3. The method of claim 1 wherein substantially removing the overflow regions includes removing at least 60% of the overflow regions.

4. The method of claim 3 wherein substantially removing the overflow regions includes removing at least 80% of the overflow regions.

5. The method of claim 1 wherein separating the lens substrate into the smaller substrates comprises separating the lens substrate into smaller substrates having lateral areas that are less than 1.2millimeters by 1.2 millimeters.

6. The method of claim 5 wherein the lateral areas are less than 0.9millimeters by 0.9 millimeters.

7. A manufacturing method for miniature wafer-level camera modules, the manufacturing method comprising:
   providing a lens substrate having an array of lenses, the lens substrate including an overflow region next to each lens of the array, each overflow region including an overflow lens material, wherein the lens substrate is molded with a lens molding master comprising lens cavities for the array of lenses, overflow cavities for the overflow regions, and flat contact surfaces around the lens cavities and between the lens cavities and the overflow cavities, and wherein the flat contact surfaces are designed to contact the lens substrate when the molding master is brought into contact with the lens substrate;

providing an image sensor array substrate having an array of image sensor arrays;

bonding the lenses with the image sensor array substrate; and performing one or more sets of dicing operations to dice the lens substrate and the image sensor array substrate into individual modules each having an image sensor array and one of a single lens and a plurality of stacked lenses, wherein performing the one or more sets of dicing operations includes substantially removing the overflow regions.

8. The method of claim 7 wherein said bonding and said performing the one or more sets of dicing operations comprises:

wafer bonding the lens substrate having the array of lenses and the image sensor array substrate; and dicing the bonded lens and image sensor array substrates into the individual modules, wherein the dicing substantially removes the overflow regions.

9. The method of claim 7 wherein said bonding and said performing the one or more sets of dicing operations comprises:

dicing the lens substrate having the array of lenses into individual lens die each having one of a single lens and a plurality of stacked lenses;

bonding each lens die to a corresponding image sensor array of the image sensor array substrate; and dicing the image sensor array substrate having the lens die bonded thereto into the individual modules.

10. The method of claim 9 wherein dicing the lens substrate substantially removes the overflow regions.

11. The method of claim 7 wherein performing the one or more sets of dicing operations to dice the lens substrate and the image sensor array substrate into the individual modules comprises dicing into individual modules having lateral areas that are less than 1.2 millimeters by 1.2 millimeters.

12. The method of claim 7 wherein providing the image sensor array substrate comprises providing an image sensor array substrate having one or more through-silicon vias.

* * * * *